United States Patent
Weber et al.

(10) Patent No.: US 9,076,814 B2
(45) Date of Patent: Jul. 7, 2015

(54) ENHANCED DISLOCATION STRESS TRANSISTOR

(71) Applicant: Intel Corporation, Santa Clara, CA (US)

(72) Inventors: Cory Weber, Hillsboro, OR (US); Mark Liu, West Linn, OR (US); Anand Murthy, Portland, OR (US); Hemant Deshpande, Beaverton, OR (US); Daniel B. Aubertine, North Plains, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/297,847

(22) Filed: Jun. 6, 2014

(65) Prior Publication Data
US 2014/0284626 A1 Sep. 25, 2014

Related U.S. Application Data

(62) Division of application No. 12/191,814, filed on Aug. 14, 2008, now Pat. No. 8,779,477.

(51) Int. Cl.
| | | |
|---|---|---|
| H01L 29/76 | (2006.01) | |
| H01L 29/66 | (2006.01) | |
| H01L 21/265 | (2006.01) | |
| H01L 29/417 | (2006.01) | |
| H01L 29/78 | (2006.01) | |

(52) U.S. Cl.
CPC .... *H01L 29/66477* (2013.01); *H01L 21/26506* (2013.01); *H01L 29/41783* (2013.01); *H01L 29/66628* (2013.01); *H01L 29/78* (2013.01); *H01L 29/7848* (2013.01); *H01L 29/7849* (2013.01)

(58) Field of Classification Search
None
See application file for complete search history.

(56) References Cited

U.S. PATENT DOCUMENTS

| | | |
|---|---|---|
| 2006/0202234 A1 | 9/2006 | Hara |
| 2007/0254444 A1* | 11/2007 | Bloomquist et al. .......... 438/305 |
| 2008/0135873 A1 | 6/2008 | Fiorenza et al. |

* cited by examiner

*Primary Examiner* — Sonya B McCall Shepard
(74) *Attorney, Agent, or Firm* — Winkle, PLLC

(57) ABSTRACT

A device is provided. The device includes a transistor formed on a semiconductor substrate, the transistor having a conduction channel. The device includes at least one edge dislocation formed adjacent to the conduction channel on the semiconductor substrate. The device also includes at least one free surface introduced above the conduction channel and the at least one edge dislocation.

16 Claims, 5 Drawing Sheets

ENHANCED DISLOCATION STRESS TRANSISTOR

RELATED APPLICATION

This application is a divisional of U.S. patent application Ser. No. 12/191,814, entitled "ENHANCED DISLOCATION STRESS TRANSISTOR," filed on Aug. 14, 2008.

BACKGROUND

Transistors are well known in the art. Typically, integrated circuits include a combination of n-type metal oxide semiconductor (NMOS) and p-type metal oxide semiconductor (PMOS) transistors formed on a substrate. The performance and reliability of an integrated circuit is directly related to performance of transistors of which it is comprised.

A typical metal oxide semiconductor transistor includes a gate, a drain contact and a source contact formed on a substrate. During operation, when a voltage is applied to the gate that is greater than the threshold voltage of the transistor, the transistor turns on and current flows in a conduction channel formed below the gate and between the source and the drain. The current that flows in the conduction channel is termed as drive current or saturation drive current. It is desirable to improve the drive current to enhance the performance of the transistor.

BRIEF DESCRIPTION OF THE DRAWINGS

Features of embodiments of the claimed subject matter will become apparent as the following detailed description proceeds, and upon reference to the drawings, in which like numerals depict like parts, and in which:

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a metal-oxide-semiconductor field effect transistor (MOSFET) in which any free surfaces introduced are elevated above a conduction channel of the transistor. In particular, the present technique elevates such free surfaces to retain tensile stresses introduced by edge dislocations at the level of the conduction channel.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
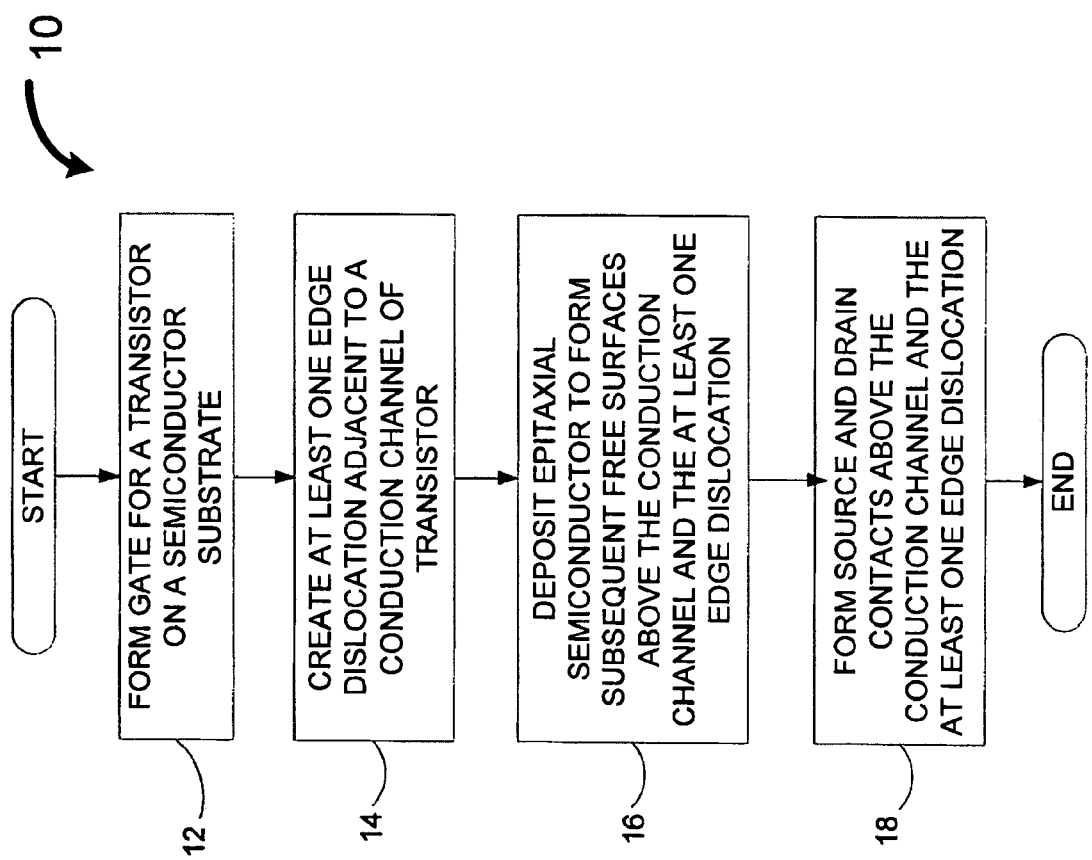
FIG. 1 illustrates an exemplary process for forming one or more transistors on a substrate.

Referring first to FIG. 1, an exemplary process 10 for forming one or more transistors on a substrate is illustrated. At block 12, a gate for a transistor is formed on a semiconductor substrate. In certain embodiments, a dummy gate for the transistor may be formed on the semiconductor substrate. In one exemplary embodiment, a gate for an n-type metal oxide semiconductor (NMOS) transistor is formed on the substrate. In one exemplary embodiment, the substrate comprises a single crystal substrate. In one embodiment, the transistor includes a source region, a drain region, a gate dielectric layer formed on the semiconductor substrate and a gate formed on the gate dielectric layer. Further, the transistor includes a conduction channel beneath the gate dielectric layer and between the source and the drain.

At block 14, at least one edge dislocation such as a vacancy edge dislocation is created adjacent to the conduction channel. As used herein, the term vacancy edge dislocation refers to a defect where a missing half-plane of atoms is introduced inside the crystal. In this embodiment, one side of the half-plane terminates in the crystal, introducing tensile strain at the unoccupied lattice sites. Further, the other end of the missing half-plane of atoms terminates at the crystal surface. In this embodiment, at least one edge dislocation creates tensile stress in the conduction channel. Further, the tensile stress from the at least one edge dislocation increases electron mobility in the conduction channel. In one exemplary embodiment, the at least one edge dislocation may be introduced by amorphizing the semiconductor substrate by implanting high dose silicon and then recrystallizing the substrate with an anneal. However, other techniques of creating the at least one edge dislocation may be envisaged.

It should be noted that subsequent processing which may result in a free surface introduced at the level of the conducting channel and the at least one edge dislocation will relieve the stress from the dislocation, reducing the mobility gain. Therefore, steps must be taken to ensure any free surface introduced is above the conducting channel. At block 16, at least one free surface may be introduced above the conduction channel. In one exemplary embodiment, having the at least one free surface above the conduction channel will have no impact to the tensile stress in the conduction channel thereby retaining the tensile stress in the conduction channel. In this embodiment, epitaxial semiconductor material is deposited on the source and drain regions above the conduction channel. Further, portions of the semiconductor material may be etched to form the at least one free surface above the conduction channel and the at least one edge dislocation. At block 18, source and drain contacts are formed above the conduction channel and the at least one edge dislocation. The source and the drain contacts may be formed by using the known fabrication techniques.

Figure 2:
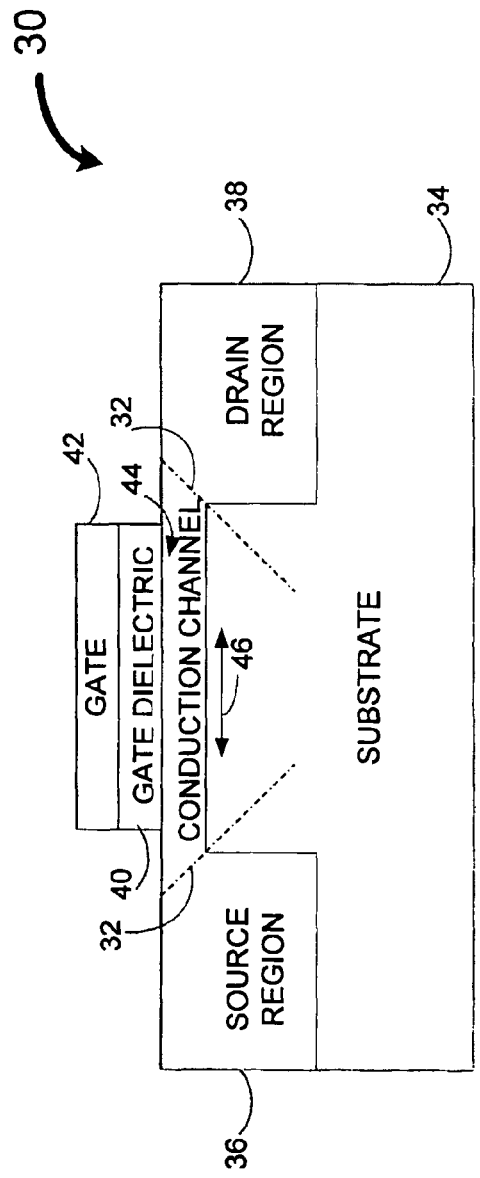
FIG. 2 is a cross-sectional view of an exemplary device having edge dislocations in accordance with embodiments of present technique.

FIG. 2 is a cross-sectional view of an exemplary device 30 having edge dislocations 32 in accordance with embodiments of present technique. In this exemplary embodiment, the device 30 includes a NMOS transistor. The device 30 includes a substrate 34. Further, the device 30 includes source and drain regions 36 and 38 formed in the substrate 34. A gate dielectric layer 40 is formed on the substrate 34 and a gate 42 is formed on the gate dielectric layer 40. The device 40 includes a conduction channel 44 formed below the gate 42 and between the source and drain regions 36 and 38.

In the illustrated embodiment, the device 40 includes the edge dislocations 32 formed adjacent to the conduction channel 44. In this embodiment, the device 40 includes two edge dislocations 32. However, a greater or a lesser number of edge dislocations 32 may be formed adjacent the conduction channel 44. The edge dislocations 32 are to increase the electron mobility in the conduction channel 44. As the electron mobility increases, the drive current of the device 30 increases. Furthermore, the edge dislocations 32 are to apply a tensile stress 46 in the conduction channel 44. In one exemplary embodiment, the edge dislocations 32 include a silicon implant in the semiconductor substrate 34. In certain embodiments, the edge dislocations 32 may be formed by amorphizing the substrate 34 by implanting high dose silicon after gate patterning and before tip implantation using conventional MOSFET processing. Subsequently, the amorphous layer is recrystallized during an anneal, forming the edge dislocation 32.

In one embodiment, the semiconductor substrate 34 is amorphized using ion implantation. After annealing, two different crystal growth fronts meet and form a missing half plane of atoms at their boundary that displaces nearby silicon atoms in the semiconductor substrate 34 and interrupts the periodicity of the crystal lattice.

Figure 3:
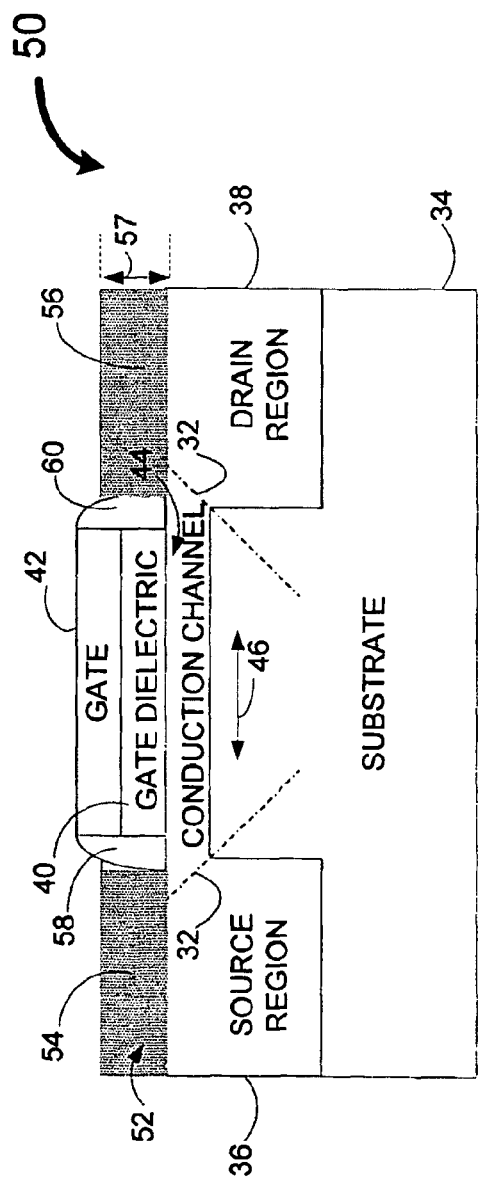
FIG. 3 is a cross-sectional view of an exemplary device having raised source and drain regions in accordance with embodiments of present technique.

FIG. 3 is a cross-sectional view of an exemplary device 50 having raised source and drain regions in accordance with embodiments of present technique. In this exemplary embodiment, a semiconductor material 52 is deposited on the source region 36 and on the drain region 38 to form a raised source 54 and a raised drain 56. In one exemplary embodiment, the semiconductor material 52 includes silicon. In another exemplary embodiment, the semiconductor material 52 includes silicon carbide. In certain other embodiments, the semiconductor material 52 includes silicon germanium, or germanium. In one embodiment, a height 57 of the deposited semiconductor material 52 is about 200 Angstroms (A°) above the conduction channel 44. It should be noted that the height 57 of the deposited material should be selected such that so any subsequent free surface introduced in the device 50 remains above the conduction channel 44.

In this embodiment, the device 50 includes a first spacer 58 formed on the semiconductor substrate 34 between the raised source 54 and the gate 42. Further, the device 50 includes a second spacer 60 formed on the semiconductor substrate 34 between the raised drain 56 and the gate 42.

Figure 4:
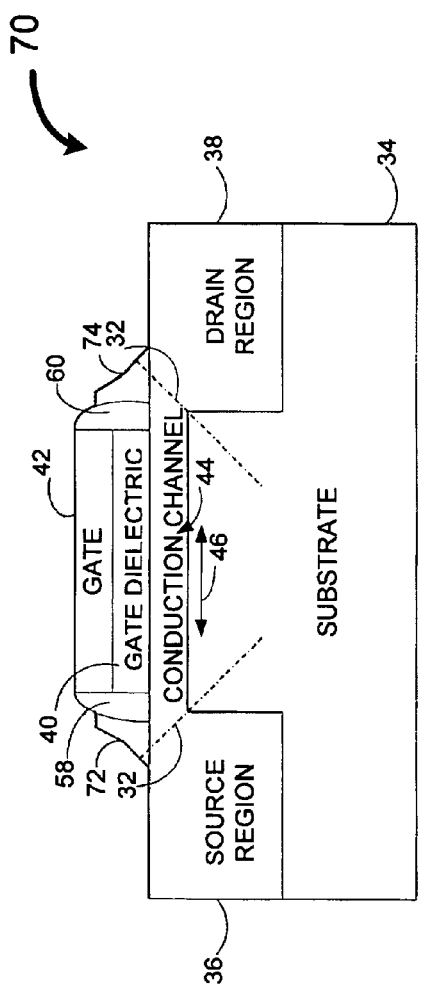
FIG. 4 is a cross-sectional view of an exemplary device with free surfaces in accordance with embodiments of present technique.

FIG. 4 is a cross-sectional view of an exemplary device 70 with free surfaces 72 and 74 in accordance with embodiments of present technique. In this embodiment, the semiconductor material 52 (see FIG. 3) is etched away from the raised source 54 and from the raised drain 56 to form the free surfaces 72 and 74. As illustrated, the free surfaces 72 and 74 are located above the conduction channel 44 and the edge dislocations 32 thereby preserving the tensile stresses 46 in the conduction channel 44. As a result, the drive current of the device 70 is relatively higher than a device having the free surfaces at the same level as the conduction channel 44. In one exemplary embodiment, the drive current of the device 70 having free surfaces 72 and 74 above the conduction channel 44 is about 10% greater than the drive current of a device having free surfaces at the same level as the conduction channel 44.

Figure 5:
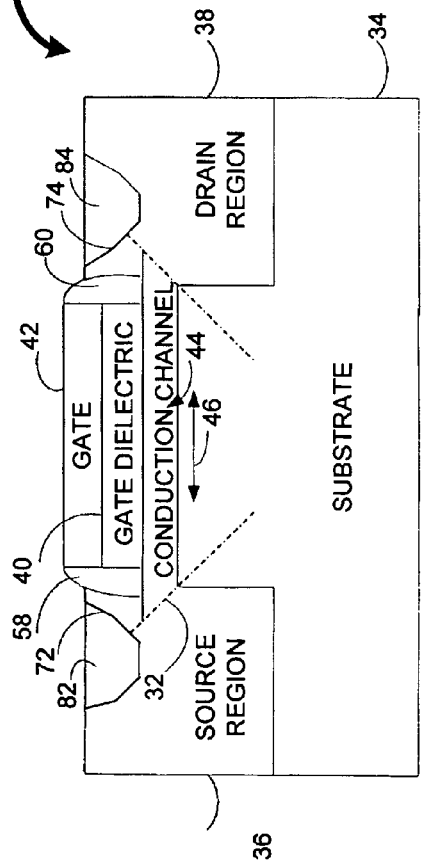
FIG. 5 is a cross-sectional view of an exemplary device with a source contact and a drain contact in accordance with embodiments of present technique.

FIG. 5 is a cross-sectional view of an exemplary device 80 with a source contact 82 and a drain contact 84 in accordance with embodiments of present technique. As described above with reference to FIG. 4, free surfaces 72 and 74 are formed above the conduction channel 44 and the edge dislocations 32 to retain the tensile stress 46 in the conduction channel 44. Furthermore, metal source contact 82 and the drain contact 84 are formed above the conduction channel 44. The source contact 82 and the drain contact 84 may be formed using known fabrication techniques.

Figure 6:
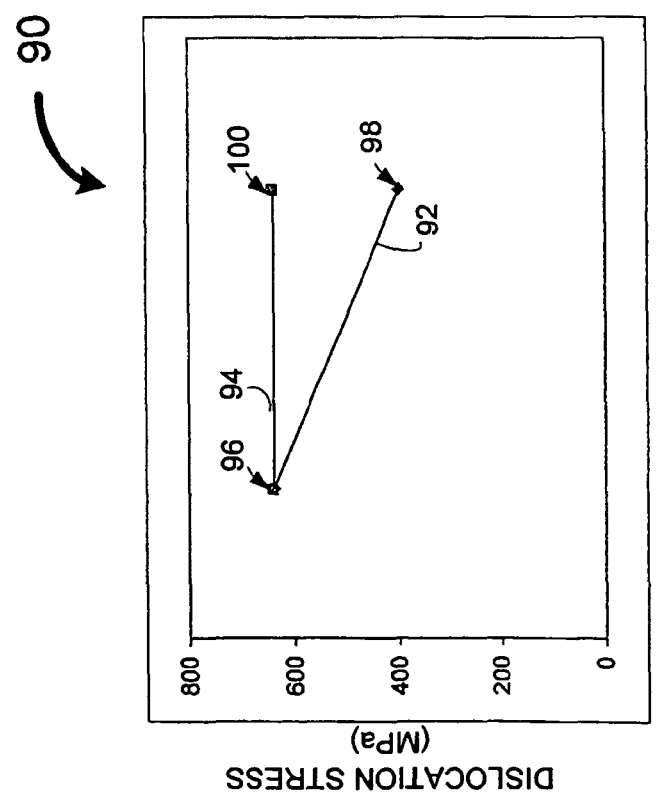
FIG. 6 is a graphical representation of simulation results for dislocation stress for device with and without free surfaces above the conduction channel of the device.

FIG. 6 is a graphical representation of simulation results 90 for dislocation stress for a device with a free surface at the level of the conduction channel and for a device with the free surfaces above the conduction channel. In this exemplary embodiment, profile 92 represents dislocation stress of the device with free surfaces at the same level as the conduction channel. Further, profile 94 represents the dislocation stress of the device with free surfaces above the conduction channel and the edge dislocations. The initial dislocation stress and final dislocation stress of the device with free surfaces at the level of the conduction channel are represented by reference numerals 96 and 98. As illustrated, for the device with the free surfaces at the same level as the conduction channel, the dislocation stress reduces from initial dislocation stress 96 of about 640 MPa to a final stress 98 of about 400 MPa. In this embodiment, the free surfaces relieve a portion of the stress introduced by edge dislocations thereby reducing the dislocation stress The final dislocation stress for the device with free surfaces above the conduction channel is represented by reference numeral 100. As illustrated, the final dislocation stress 100 is about the same magnitude of 640 MPa as the initial stress 96. In this embodiment, the dislocation stress is maintained as no free surfaces are introduced at the channel level. The free surfaces are introduced above the conduction channel and the edge dislocations thereby retaining the channel stresses.

Figure 7:
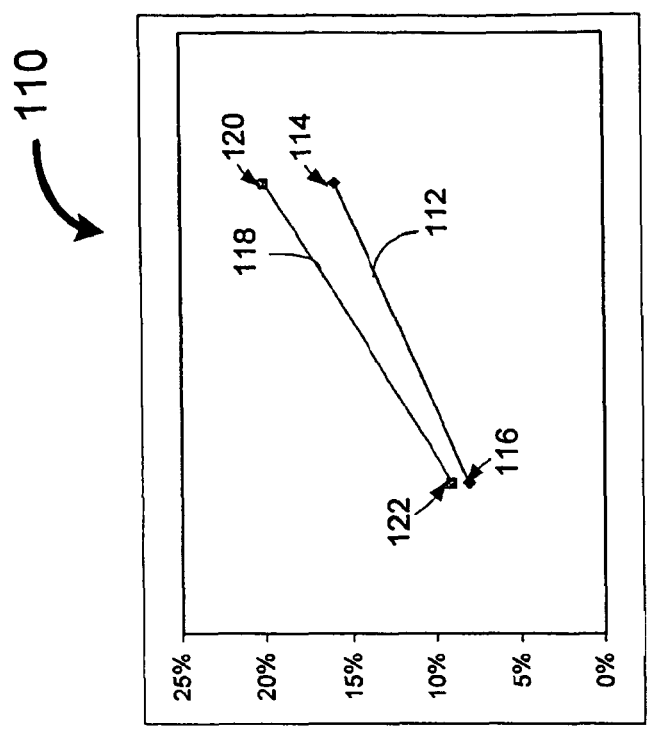
FIG. 7 is a graphical representation of simulation and measured results for saturated drive currents for device with and without free surfaces above the conduction channel of the device.

FIG. 7 is a graphical representation of simulation and measured results 110 for saturated drive currents for a device with a free surface at the level of the conduction channel and for a device with the free surface above the conduction channel of the device. In this exemplary embodiment, profile 112 represents simulated saturated drive current gain from dislocation stress. The drive current gain for the device with free surfaces above the conduction channel is represented by reference numeral 114 and the drive current gain for the device with free surfaces at the level of the conduction channel is represented by reference numeral 116. As illustrated, the saturated drive current gain 114 for the device with free surfaces above the conduction channel is about 16% as compared to a saturated drive current gain 116 of about 8% for the device with free surfaces at the same level as of the conduction channel.

In the illustrated embodiment, profile 118 represents measured saturated drive current gain from dislocation stress. The measured drive current gain for the device with free surfaces above the conduction channel is represented by reference numeral 120 and the measured drive current gain for the device with free surfaces at the level of the conduction channel is represented by reference numeral 122. As illustrated, the saturated drive current gain 120 for the device with free surfaces above the conduction channel is about 20% as compared to a saturated drive current gain 122 of about 9% for the device with free surfaces at the same level as of the conduction channel. Thus, having the free surfaces above the conduction channel and the edge dislocations substantially increases the drive current by retaining the tensile stresses introduced by the edge dislocations.

Figure 8:
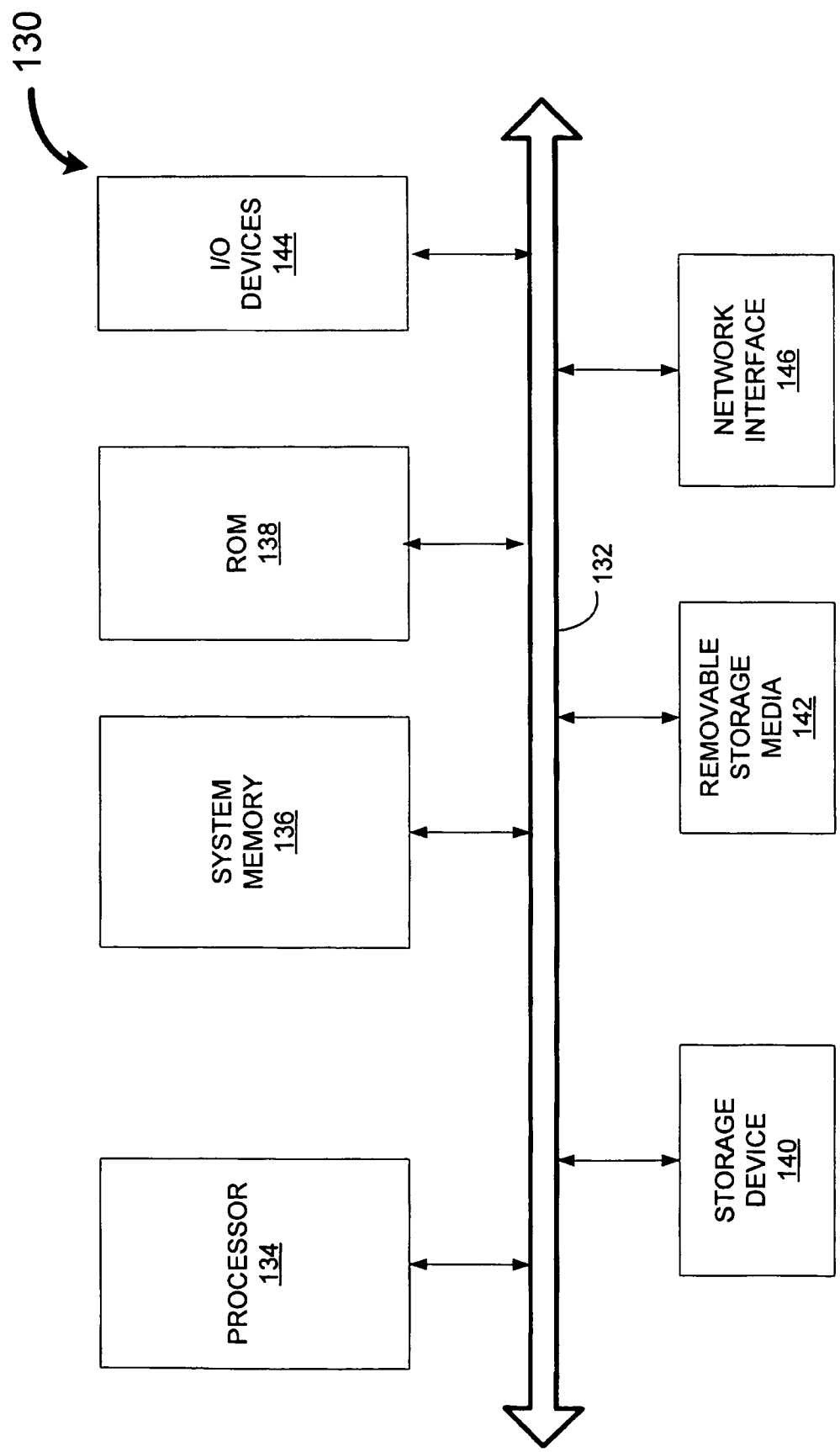
FIG. 8 illustrates an embodiment of a computer system.

The device described above may be disposed in a computer system, a wireless communicator and a hand-held device. FIG. 8 illustrates an embodiment of a computer system 130. The computer system 130 includes a bus 132 to which the various components are coupled. In certain embodiments, the bus 132 includes a collection of a plurality of buses such as a system bus, a Peripheral Component Interface (PCI) bus, a Small Computer System Interface (SCSI) bus, etc. Representation of these buses as a single bus 132 is provided for ease of illustration, and it should be understood that the system 130 is not so limited. Those of ordinary skill in the art will appreciate that the computer system 130 may have any suitable bus architecture and may include any number of combination of buses.

A processor 134 is coupled to the bus 132. The processor 134 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 8 shows a single processor 134, the computer system 1310 may include two or more processors.

The computer system 130 further includes system memory 136 coupled to the bus 132. The system memory 136 may include any suitable type and number of memories, such as static random access memory (SRAM), dynamic random access memory (DRAM), synchronous dynamic random access memory (SDRAM), or double data rate DRAM (DDRDRAM). During operation of the computer system 130, an operating system and other applications may be resident in the system memory 136.

The computer system 130 may further include a read-only memory (ROM) 138 coupled to the bus 132. The ROM 138 may store instructions for the processor 134. The computer system 130 may also include a storage device (or devices) 140 coupled to the bus 132. The storage device 140 includes any suitable non-volatile memory, such as, for example, a hard disk drive. The operating system and other programs may be stored in the storage device 140. Further, a device 142 for accessing removable storage media (e.g., a floppy disk drive or a CD ROM drive) may be coupled to the bus 132.

The computer system 130 may also include one or more Input/Output (I/O) devices 144 coupled to the bus 132. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 130.

The computer system 130 may further comprise a network interface 146 coupled to the bus 132. The network interface 146 comprises any suitable hardware, software, or combination of hardware and software that is capable of coupling the system 130 with a network (e.g., a network interface card). The network interface 146 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (Hyper-Text Transmission Protocol, as well as others.

It should be understood that the computer system 130 illustrated in FIG. 8 is intended to represent an embodiment of such a system and, further, that this system may include any additional components, which have been omitted for clarity and ease of understanding. By way of example, the system 130 may include a direct memory access (DMA) controller, a chip set associated with the processor 134, additional memory (e.g., cache memory) as well as additional signal lines and buses. Also, it should be understood that the computer system 130 may not include all the components shown in FIG. 7. The computer system 130 may comprise any type of computing device, such as a desktop computer, a laptop computer, a server, a hand-held computing device, a wireless communication device, an entertainment system etc.

In this embodiment, the computer system 130 may include the device as described in the embodiments above. By way of example, the processor 134 may include a plurality of transistors formed on a semiconductor substrate. Each of the transistors may include a conduction channel and at least one edge dislocation formed adjacent to the conduction channel. The at least one edge dislocation is to apply a tensile stress in the conduction channel. Further, each of the transistors may include free surfaces introduced above the level of the conduction channel. The at least one free surface is to retain the tensile stress in the conduction channel.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A method, comprising:
    forming a transistor on a semiconductor substrate, the transistor having a conduction channel;
    creating at least one edge dislocation adjacent to the conduction channel to apply tensile stress in the conduction channel;
    introducing at least one free surface above the conduction channel and the at least one edge dislocation to retain the tensile stress in the conduction channel; and
    depositing a semiconductor material on a source region and a drain region of the transistor above the conduction channel and the at least one edge dislocation.

2. The method of claim 1, further comprising etching the semiconductor material to form the at least one free surface above the conduction channel and the at least one edge dislocation.

3. The method of claim 1, further comprising:
    forming a first spacer on the semiconductor substrate between the source region and a gate of the transistor; and
    forming a second spacer on the semiconductor substrate between the drain region and the gate.

4. The method of claim 1, further comprising forming an n-type metal oxide semiconductor (NMOS) transistor on the semiconductor substrate.

5. The method of claim 2, further comprising forming a source contact and a drain contact above the conduction channel and the at least one edge dislocation.

6. A system, comprising:
    a processor having a plurality of transistors formed on a semiconductor substrate, wherein each of the plurality of transistors comprises:
        a conduction channel;

at least one edge dislocation formed adjacent to the conduction channel on the semiconductor substrate, wherein the at least one edge dislocation is to apply tensile stress in the conduction channel, wherein the at least one edge dislocation is to increase electron mobility in the conduction channel, and wherein the at least one edge dislocation comprises a silicon implant in the semiconductor substrate; and at least one free surface introduced above the conduction channel and the at least one edge dislocation, wherein the at least one free surface is to retain the tensile stress in the conduction channel; and a removable storage media.

7. The system of claim 6, wherein the transistor comprises an n-type metal oxide semiconductor (NMOS) transistor.

8. A system comprising;
a processor having a plurality of transistors formed on a semiconductor substrate, wherein each of the plurality of transistors comprises:
a conduction channel;
at least one edge dislocation formed adjacent to the conduction channel on the semiconductor substrate, wherein the at least one edge dislocation is to apply tensile stress in the conduction channel; and
at least one free surface introduced above the conduction channel and the at least one edge dislocation, wherein the at least one free surface is to retain the tensile stress in the conduction channel;
a semiconductor material deposited on a source region and a drain region of the transistor to form the at least one free surface above the conduction channel and the at least one edge dislocation; and
a removable storage media.

9. The system of claim 8, wherein the semiconductor material comprises silicon.

10. The system of claim 8, wherein the semiconductor material comprises silicon carbide.

11. A method, comprising:
forming a transistor on a semiconductor substrate, the transistor having a conduction channel;
applying tensile stress in the conduction channel through at least one edge dislocation disposed adjacent to the conduction channel on the semiconductor substrate;
retaining the tensile stress in the conduction channel through at least one free surface formed above the conduction channel and the at least one edge dislocation; and
depositing a semiconductor material on a source region and a drain region of the transistor above the conduction channel and the at least one edge dislocation.

12. The method of claim 11, further comprising increasing electron mobility in the conduction channel through the at least one edge dislocation.

13. The method of claim 11, further comprising forming an n-type metal oxide semiconductor (NMOS) transistor on the semiconductor substrate.

14. The method of claim 11, further comprising etching the semiconductor material to form the at least one free surface above the conduction channel and the at least one edge dislocation.

15. The method of claim 11, further comprising increasing a drive current of the transistor.

16. The method of claim 14, further comprising forming the at least one free surface at a distance of about 200 Angstroms (A°) above the conduction channel.

* * * * *